(12) United States Patent
Kakoschke et al.

(10) Patent No.: US 7,834,403 B2
(45) Date of Patent: Nov. 16, 2010

(54) BIPOLAR TRANSISTOR FINFET TECHNOLOGY

(75) Inventors: Ronald Kakoschke, München (DE); Klaus Schrüfer, Baldham (DE)

(73) Assignee: Infineon Technologies AG, Neubiberg (DE)

( * ) Notice: Subject to any disclaimer, the term of this patent is extended or adjusted under 35 U.S.C. 154(b) by 298 days.

(21) Appl. No.: 11/837,972

(22) Filed: Aug. 13, 2007

(65) Prior Publication Data

US 2009/0045467 A1    Feb. 19, 2009

(51) Int. Cl.
| | |
|---|---|
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |

(52) U.S. Cl. ............... 257/370; 257/382; 257/385; 438/189; 438/202

(58) Field of Classification Search ........... 257/370, 257/382, 385, E21.632; 438/189, 202
See application file for complete search history.

(56) References Cited

U.S. PATENT DOCUMENTS

| | | | | |
|---|---|---|---|---|
| 4,673,965 | A * | 6/1987 | Rusch ................ | 257/370 |
| 5,115,289 | A | 5/1992 | Hisamoto et al. | |
| 6,023,089 | A * | 2/2000 | Kang ................. | 257/347 |
| 6,943,083 | B2 * | 9/2005 | Forbes ............... | 438/259 |
| 6,982,181 | B2 * | 1/2006 | Hideo ................ | 438/30 |
| 7,173,320 | B1 * | 2/2007 | Rahim ............... | 257/557 |
| 7,476,942 | B2 * | 1/2009 | Watanabe et al. ..... | 257/370 |
| 7,538,391 | B2 * | 5/2009 | Chidambarrao et al. | 257/347 |

OTHER PUBLICATIONS

"*Restriction Requirement Received*", Restriction Requirement Received, Restriction Requirement Received, 4 pages Aug. 10, 2009.
Hisamoto, "FinFET—A self-aligned double-gate MOSFET scalable to 20 nm", *IEEE Transactions on Electron Devices*, 47(12), (Dec. 2000).
Pellizzer, F, et al., "A 90nm Phase Change Memory Technology for Stand-Alone Non-Volatile Memory Applications", *Symposium on VLSI Technology, Digest of Technical Papers*, (2006), 2 pgs.
Tilke, Armin T, et al., "Quarter micron BiCMOS technology platform with implanted-base- or SiGe-bipolar transistor for wireless communication ICs", *Solid-state electronics*, 48(12), (2004), 2243-2249.
Tomislav Suligoj, Haitao Liu, Johnny K.O. Sin, Kenneth Tsui, Rongming Chu, Kevin J. Chen, Petar Biljanovic, Kang L. Wang; A low-cost horizontal current bipolar transistor (HCBT) technology for the BiCMOS integration with FinFETs; Received Dec. 10, 2003; accepted Mar. 15, 2004; Solid-State Electronics 48 (2004); pp. 2047-2050.

* cited by examiner

*Primary Examiner*—Phuc T Dang
(74) *Attorney, Agent, or Firm*—Infineon Technologies; Philip H. Schlazer

(57) ABSTRACT

This document discusses, among other things, apparatus having at least one CMOS transistor overlying a substrate; and at least one finned bipolar transistor overlying the substrate and methods for making the apparatus.

28 Claims, 11 Drawing Sheets

| BLOCK | PROCESS OPERATION | FINNED BIPOLAR TRANSISTOR - FinBIP | FinFET CMOS |
|---|---|---|---|
| 501 | PREPARATION OF WAFER SURFACE | X | X |
| 502 | COLLECTOR IMPLANTS (PLANAR) | FOR LIGHTLY DOPED COLLECTOR REGION | CAN SERVE AS WELL DOPING |
| 503 | LITHOGRAPHY FOR FORMING AND ETCHING FIN | FINS FOR FinBIP | FINS FOR FinFETs |
| 504 | SACRIFICIAL DIELECTRIC DEPOSITION (E.G. OXIDE) | IS NEEDED AS ETCHSTOP FOR OPERATION 507 | IS NEEDED AS ETCHSTOP FOR OPERATION 507 |
| 505 | GATE STACK AND HARDMASK | NEEDED FOR SACRIFICIAL GATE STRUCTURE | NEEDED FOR SACRIFICIAL GATE STRUCTURE |
| 506 | GATE LITHOGRAPHY | DEFINING SACRIFICIAL "GATE" STRUCTURE | DEFINING GATES FOR FETs |
| 507 | GATE ANISOTROPIC ETCH | ETCHING SACRIFICIAL "GATE" STRUCTURE | ETCHING GATES FOR FETs |
| 508 | SIDEWALL SPACER (E.G. OXIDE) | PROVIDES SPACING BETWEEN EMITTER/COLLECTOR TO BASE REGION TO AVOID SHORTING | EXTENSIONS FOR FETs |
| 509 | FORM EXTENSION IMPLANTS | NOT NEEDED FOR BIP | ONLY NEEDED FOR FETs |
| 510 | FORM SPACER 2 | PROVIDES SPACING BETWEEN EMITTER/COLLECTOR TO BASE REGION TO AVOID SHORTING | EXTENSIONS FOR FETs |
| 511 | LITHOGRAPHY FOR S/D & EMITTER/COLLECTOR CONTACT AREA | DEFINES EMITTER AND HEAVILY DOPED COLLECTOR AREAS | DEFINES S/D IMPLANT FOR FETs |
| 512 | IMPLANT COLLECTOR/EMITTER (SOURCE/DRAIN) USING RESIST MASK | LIGHTLY DOPED COLLECTOR AREA IS BLOCKED BY RESIST | S/D IMPLANT |
| 513 | PLANARIZATION (E.G. DEPOSITION OF BSG FOLLOWED BY CMP) | THIS OPERATION NEEDED FOR "GATE" REPLACEMENT | THIS OPERATION NEEDED FOR "GATE" REPLACEMENT |
| 514 | ETCH GATE STACK MATERIAL (I.E. POLYSILICON) SELECTIVELY TO PLANARIZATION MATERIAL AND SPACERS, STOP ON SACRIFICIAL DIELECTRIC ON FIN | REMOVE SACRIFICIAL POLYSILICON TO ALLOW BASE ELECTRODE REPLACEMENT | REMOVE SACRIFICIAL POLYSILICON TO ALLOW BASE ELECTRODE REPLACEMENT |
| 515 | FORM INNER SPACER (FOR BASE WIDTH ADJUSTMENT) | SPACER IS USED TO FINE TUNE BASE WIDTH | SPACER CAN BE REMOVED IN CMOS REGIONS |
| 516 | TILTED BASE IMPLANT (ADJUSTS BASE COLLECTOR DOPING GRADIENT) | FINE TUNING THE BASE-COLLECTOR DOPING GRADIENT | CMOS REGIONS ARE PROTECTED (E.G. BY RESIST) |
| 517 | ETCH SACRIFICIAL DIELECTRIC | REMOVES OXIDE TO PROVIDE CLEAN SURFACE FOR GATE OXIDATION | REMOVE OXIDE TO PROVIDE CLEAN SURFACE FOR GATE OXIDATION |
| 518 | DEPOSIT GATE DIELECTRIC | NOT NEEDED FOR BIP (REMOVED AT 520) | GATE OXIDE FOR CMOS |
| 519 | LITHOGRAPHY TO SELECT AREAS OF FinBIP | OPENS BIP REGIONS | CMOS REGIONS ARE TO BE PROTECTED (E.G. BY RESIST) |
| 520 | ETCH GATE DIELECTRIC | REMOVES GATE OXIDE TO PROVIDE CONTACT BETWEEN BASE REGION AND BASE ELECTRODE | CMOS REGIONS ARE TO B/E PROTECTED (E.G. BY RESIST) |
| 521 | DEPOSITION OF GATE STACK POLYSILICON OR METAL MATERIAL | SERVES AS BASE ELECTRODE MATERIAL | SERVES AS GATE MATERIAL |
| 522 | PLANARIZATION CMP | X | X |
| 523 | BEOL | X | X |

*FIG. 5*

| BLOCK | PROCESS OPERATION | FINNED BIPOLAR TRANSISTOR - FinBIP | FinFET CMOS |
|---|---|---|---|
| 601 | PREPARATION OF WAFER SURFACE | X | X |
| 602 | COLLECTOR IMPLANTS (PLANAR) | FOR LIGHTLY DOPED COLLECTOR REGION | CAN SERVE AS WELL DOPING |
| 603 | LITHOGRAPHY FOR FORMING AND ETCHING FIN | FINS FOR FinBIP | FINS FOR FinFETs |
| 604 | SACRIFICIAL DIELECTRIC DEPOSITION (E.G. OXIDE) | IS NEEDED AS ETCHSTOP FOR OPERATION 607 | IS NEEDED AS ETCHSTOP FOR OPERATION 607 |
| 605 | GATE STACK AND HARDMASK | NEEDED FOR SACRIFICIAL GATE STRUCTURE | NEEDED FOR SACRIFICIAL GATE STRUCTURE |
| 606 | GATE LITHOGRAPHY | DEFINING SACRIFICIAL "GATE" STRUCTURE | DEFINING SACRIFICIAL "GATE" STRUCTURE |
| 607 | GATE ANISOTROPIC ETCH | ETCHING SACRIFICIAL "GATE" STRUCTURE | ETCHING SACRIFICIAL "GATE" STRUCTURE |
| 608 | SIDEWALL SPACER (E.G. OXIDE) | PROVIDES SPACING BETWEEN EMITTER/COLLECTOR TO BASE REGION TO AVOID SHORTING | PROVIDES SPACING BETWEEN EMITTER/COLLECTOR TO BASE REGION TO AVOID SHORTING |
| 609 | FORM EXTENSION IMPLANTS | NOT NEEDED FOR BIP | ONLY NEEDED FOR FETs |
| 610 | FORM SPACER 2 | PROVIDES SPACING BETWEEN EMITTER/COLLECTOR TO BASE REGION TO AVOID SHORTING | EXTENSIONS FOR FETs |
| 611 | LITHOGRAPHY FOR S/D & EMITTER/COLLECTOR CONTACT AREA | DEFINES EMITTER AND COLLECTOR AREAS - LIGHTLY DOPED COLLECTOR AREA IS PROTECTED BY SHADOWING EFFECT OF IMPLANT AT OPERATION 614 | DEFINES S/D IMPLANT FOR FETs |
| 612 | IMPLANT COLLECTOR/EMITTER (SOURCE/DRAIN) USING RESIST MASK | EMITTER AND COLLECTOR AREAS, LIGHTLY DOPED COLLECTOR AREA IS PROTECTED BY SHADOWING EFFECT OF IMPLANT | S/D IMPLANT |
| 613 | PLANARIZATION (E.G. DEPOSITION OF BSG FOLLOWED BY CMP) | THIS OPERATION NEEDED FOR "GATE" REPLACEMENT | THIS OPERATION NEEDED FOR "GATE" REPLACEMENT |
| 614 | ETCH GATE STACK MATERIAL (I.E. POLYSILICON) SELECTIVELY TO PLANARIZATION MATERIAL AND SPACERS, STOP ON SACRIFICIAL DIELECTRIC ON FIN | REMOVE SACRIFICIAL POLYSILICON TO ALLOW BASE ELECTRODE REPLACEMENT | REMOVE SACRIFICIAL POLYSILICON TO ALLOW BASE ELECTRODE REPLACEMENT |
| 615 | FORM INNER SPACER (FOR BASE WIDTH ADJUSTMENT) | NOT APPLIED HERE | NOT APPLIED HERE |
| 616 | TILTED BASE IMPLANT (ADJUSTS BASE COLLECTOR DOPING GRADIENT) | FINE TUNING THE BASE-COLLECTOR DOPING GRADIENT | CMOS REGIONS ARE PROTECTED (E.G. BY RESIST) |
| 617 | ETCH SACRIFICIAL DIELECTRIC | REMOVE OXIDE TO PROVIDE CLEAN SURFACE FOR GATE OXIDATION | REMOVE OXIDE TO PROVIDE CLEAN SURFACE FOR GATE OXIDATION |
| 618 | DEPOSIT GATE DIELECTRIC | NOT NEEDED FOR BIP (REMOVED AT 620) | GATE OXIDE FOR CMOS |
| 619 | LITHOGRAPHY TO SELECT AREAS OF FinBIP | OPENS BIP REGIONS | CMOS REGIONS ARE TO BE PROTECTED (E.G. BY RESIST) |
| 620 | ETCH GATE DIELECTRIC | REMOVES GATE OXIDE TO PROVIDE CONTACT BETWEEN BASE REGION AND BASE ELECTRODE | CMOS REGIONS ARE TO BE PROTECTED (E.G. BY RESIST) |
| 621 | DEPOSITION OF GATE STACK POLYSILICON OR METAL MATERIAL | SERVES AS BASE ELECTRODE MATERIAL | SERVES AS BASE ELECTRODE MATERIAL |
| 622 | PLANARIZATION CMP | X | X |
| 623 | BEOL | X | X |

FIG. 6

| BLOCK | PROCESS OPERATION | FINNED BIPOLAR TRANSISTOR - FinBIP | FinFET CMOS |
|---|---|---|---|
| 701 | PREPARATION OF WAFER SURFACE | X | X |
| 702 | BASE IMPLANT (PLANAR) | FOR BASE DOPING | CAN SERVE AS WELL DOPING |
| 703 | LITHOGRAPHY FOR FORMING AND ETCHING FIN | FINS FOR FinBIP | FINS FOR FinFETs |
| 704 | SACRIFICIAL DIELECTRIC DEPOSITION (E.G. OXIDE) | IS NEEDED AS ETCHSTOP FOR OPERATION 707 | IS NEEDED AS ETCHSTOP FOR OPERATION 707 |
| 705 | GATE STACK AND HARDMASK | MATERIAL FOR BASE ELECTRODE | MATERIAL FOR GATE ELECTRODE |
| 706 | GATE LITHOGRAPHY | DEFINING BASE ELECTRODE | DEFINING GATES FOR FETs |
| 707 | GATE ANISOTROPIC ETCH, STOP ON CONDUCTING LAYER | ETCHING BASE ELECTRODE | ETCHING GATES FOR FETs |
| 708 | REMOVE CONDUCTING LAYER | REMOVING CONDUCTING LAYERS FROM THE BASE REGIONS. BASE REGIONS ARE PROTECTED BY THE BASE ELECTRODE | |
| 709 | FORM SIDEWALL SPACER (E.G. OXIDE) | PROVIDES SOME SPACING BETWEEN EMITTER/COLLECTOR TO BASE REGION IN ORDER TO AVOID SHORTING | EXTENSION FOR FETs |
| 710 | FORM SPACER 2 | PROVIDES SPACING BETWEEN EMITTER/COLLECTOR TO BASE REGION IN ORDER TO AVOID SHORTING | EXTENSION FOR FETs |
| 711 | VERTICAL COLLECTOR IMPLANT | FOR LIGHTLY DOPED COLLECTOR REGIONS | NEGLIGIBLE CONTRIBUTION TO S/D DOPING |
| 712A | TILTED COLLECTOR IMPLANT | LIGHTLY DOPED COLLECTOR AREA IS PROTECTED BY SHADOWING EFFECT OF IMPLANT | CMOS AREAS ARE PROTECTED |
| 712B | ALTERNATIVE PROCESS; COLLECTOR CONTACT/EMITTER (SOURCE/DRAIN) IMPLANTS USING RESIST MASK | EMITTER AND COLLECTOR AREAS, LIGHTLY DOPED COLLECTOR AREA IS PROTECTED BY RESIST | S/D IMPLANT |

FIG. 7

BIPOLAR TRANSISTOR FINFET TECHNOLOGY

TECHNICAL FIELD

The various embodiments described herein relate generally to transistor technology and more particularly to apparatus and method for making transistors.

BACKGROUND

Bipolar transistors are widely used in semiconductor devices. In some electronic circuit applications it is desirable to utilize bipolar transistors and CMOS devices.

Although it has been well known for a long time that reducing the size of electronic components is desirable, the practical means of doing so are not easily determined and do not yield predictable results.

In the semiconductor field, the desire to continually reduce the size of semiconductor devices has not been a progression of minor steps aimed at reducing size of various aspects of a semiconductor but has required substantial changes in the basic structure as well as in the manner of making the structure.

For a number of reasons that include reduction of semiconductor size, field effect transistors fabricated with CMOS technology have become standard for memory circuits where a large number of semiconductor devices are packed onto an integrated circuit chip. Use of CMOS technology has generally allowed a reduction of semiconductor device size from that achieved using bipolar transistor devices.

There are a number of circuit applications where increasingly large drive currents at ever increasing frequencies are to be handled. In such applications the current handling capacity of bipolar transistors is desirable although their size is a drawback. Additionally, the bipolar transistors may not be the best solution to all of the operational constraints of a particular circuit.

BRIEF DESCRIPTION OF THE DRAWINGS

FIG. 5 is a flow diagram of embodiments of some of the process steps in the manufacture of finned bipolar and FinFET transistors on the same substrate;

FIG. 6 is a flow diagram of embodiments of some of the process steps in the manufacture of finned bipolar and FinFET transistors on the same substrate;

FIG. 7 is a flow diagram of embodiments of some of the process steps in the manufacture of finned bipolar and FinFET transistors on the same substrate.

DETAILED DESCRIPTION

Figure 1:
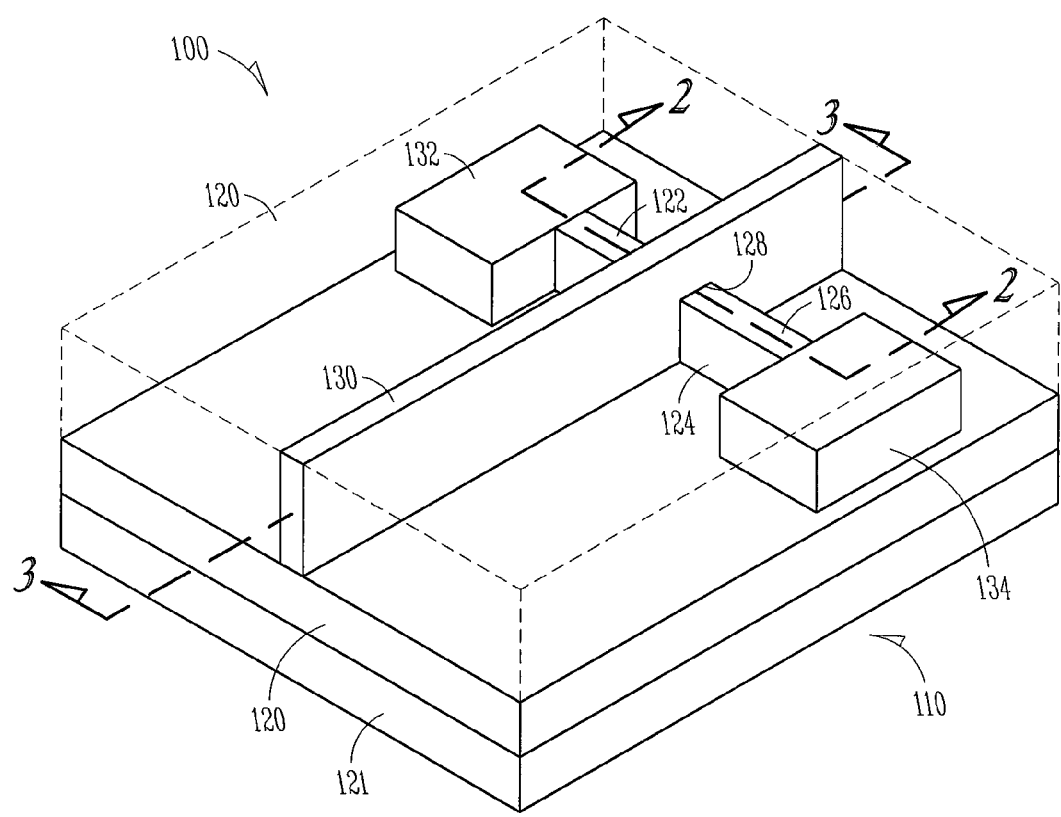
FIG. 1 shows, in perspective, a bipolar transistor in accordance with at least one embodiment of the invention.

In order to obtain the favorable operating characteristics provided by bipolar transistors and CMOS devices, there are situations where the use of bipolar transistors and CMOS transistors is desired in a single circuit. For reasons which shall be more apparent in the discussion below, manufacturing integrated circuits with both bipolar devices and CMOS devices on the same chip requires solutions which are more than a simple combining of manufacturing steps used in the manufacture of CMOS and bipolar transistors.

Bipolar transistors in BiCMOS circuits are generally formed as vertical bipolar transistors. Reduction of the size of such devices is often achieved by vertical scaling with steep and narrow base doping profiles. Some integrated BiCMOS structures have used SiGe-bipolar transistors. Improvements of device speed in such devices is achieved by reduction of base width. But planar integration in such devices is often achieved at the cost of greatly reduced performance levels because the semiconductor feature sizes available have been too large using vertical bipolar transistors and planar CMOS integration.

The manufacturing processes for bipolar transistors and CMOS devices are fundamentally different. For that reason, realization of circuits having both bipolar and CMOS devices using the exercise of ordinary skill could be addressed by forming the bipolar and CMOS devices on separate chips. But the difficulties in interconnecting such hybrid circuits lead to reduced performance levels because of the physical sizes of the devices and the circuitry for interconnecting them.

In order to deal with these difficulties, various bipolar and CMOS technology solutions have been proposed. To date, attempts at providing BiCMOS circuits on a single chip have been very complex, at least in part, because of the unpredictability of the manufacturing process steps if BiCMOS and bipolar manufacturing operations are combined. Those integration efforts have generally been aimed at forming the bipolar devices as vertically-stacked regions typical of most bipolar devices.

As processes evolved to make CMOS devices increasingly smaller, the size constraints of such scaling efforts exceeded what could be accomplished using conventional photolithography techniques. To address this need, FinFET devices were conceived to allow manufacture of CMOS devices several orders of magnitude smaller than could be achieved using planar CMOS device manufacturing processes.

Forming hybrid circuits on single wafer substrates including both FinFET CMOS devices and finned bipolar transistors is possible using modifications of fin forming techniques previously used to form FinFET devices. Embodiments of the present subject matter allow both FinFET and finned bipolar devices to be formed on a single chip substrate. Using embodiments of our modified manufacturing processes, both FinFET and finned bipolar transistors of exceedingly small size can be produced in hybrid integrated circuits formed on a single chip.

In FIG. 1, a perspective view is shown of some embodiments of a finned bipolar transistor 100 of a hybrid integrated circuit, which in some embodiments, may combine at least one bipolar transistor and at least one finFET CMOS transistor. In some other embodiments, the circuit may comprise at least one finned bipolar transistor with no CMOS devices. In some embodiments, the finned bipolar transistor 100 may be part of a memory-element-select device for a phase-change memory module since such a device allows operation of small memory cell elements with a useful switching current. Phase-change materials may be programmed between a first structural state where the material is generally more amorphous (less ordered) and a second structural state where the material is generally more crystalline (more ordered). The less ordered state generally has a higher resistivity that the more ordered state. Examples of phase-change materials include chalcogenide materials comprising at least one chalcogen element. An example of a chalcogenide phase-change material is $Ge_2Sb_2Te_5$.

In some other embodiments, a junction of the finned bipolar transistor may connected as a band-gap voltage reference for use in a CMOS circuit.

In accordance with some embodiments, at least one finned bipolar transistor 100 overlies and is supported by a buried oxide layer 120 of a silicon wafer substrate 110. Buried oxide layer 120 is above and supported by remaining silicon layers 121. The fin structure 126 of bipolar transistor 100 is quite similar to that of the fin of a FinFET CMOS device. Rather than having source/drain regions, fin 126 has collector/emitter regions 122 and 124 positioned adjacent its opposite ends. Fin 126 overlies and is supported by the surface of buried oxide layer 120 of the wafer substrate 110.

In finned bipolar transistor 100, the collector and emitter regions 122 and 124 are located on the fin 126 and are generally analogous to source/drain regions for FinFETs although their doping levels are different, as discussed below. Collector and emitter regions 122 and 124 are appropriately doped regions of fin 126, with the doping ions and concentrations determined in part by whether the bipolar transistor 100 is to be constructed in an npn or configuration or whether it is to have a pnp configuration. The discussion herein is of npn bipolar transistors and NMOS FinFETs. PMOS FinFETs and pnp bipolar transistors are achieved in a corresponding manner.

A base region 128 is located between the collector and emitter regions 122 and 124 of fin structure 126. Base region 128 is not fully visible in FIG. 1, but it can be seen in the more detailed view in FIG. 2D. Because base region 128 is in conductive contact with fin 126, it is distinguishable from the gate of a FinFET which is electrically insulated from its fin and its conductive channel.

As shown in FIG. 1, a contact line 130 overlies the surface of the substrate 110 and is in electrical conductive contact with the base region 128 of fin 126. Contact line 130 is a conductive line that, in some embodiments, is formed of polysilicon. In some embodiments, contact line 130 is metallic or is a metal. In an embodiment, the material is selected from a group of conductors consisting of polysilicon, gold, copper, and aluminum and alloys thereof.

Also shown in FIG. 1 are collector and emitter contact landing pads 132 and 134 that are adjacent to and in electrical contact with the respective collector and emitter regions 122 and 124 of fin structure 126. Landing areas 132 and 134 are used to connect the electrodes of transistor 100 to other areas of integrated circuit 100 using vias and metallization layers in a BEOL (back end of line) connection process. The vias and metallization layers are not shown in FIG. 1.

In FIG. 1, bipolar transistor 100 is not drawn to scale and the relative sizes of its various parts are not necessarily in the same relative size relationships that are depicted. In some embodiments, the width of the fin 126 is about 20 nm and its height is about 60-80 nm.

In some embodiments, multiple finned transistors 100 are formed on the same substrate 110. In some embodiments, the finned bipolar transistors 100 are contemporaneously formed on the same substrate 110 as at least one FinFET transistor. FIGS. 2A-2D and 3A-3D are cross-sectional detail views of several manufacturing intermediate embodiments in the manufacture of finned bipolar transistor 100 of FIG. 1. FIGS. 4A and 4B are views of an alternative manufacturing intermediate embodiment of FIG. 2B and 3B respectively. Those views are taken along the longitudinal axis of fin 126 and along the longitudinal axis of contact line 130 respectively. FIGS. 2A-2D and 3A-3D also illustrate some aspects of some process actions carried out in the course of the manufacturing process shown in the process flow diagram of FIG. 5.

Figure 2A:
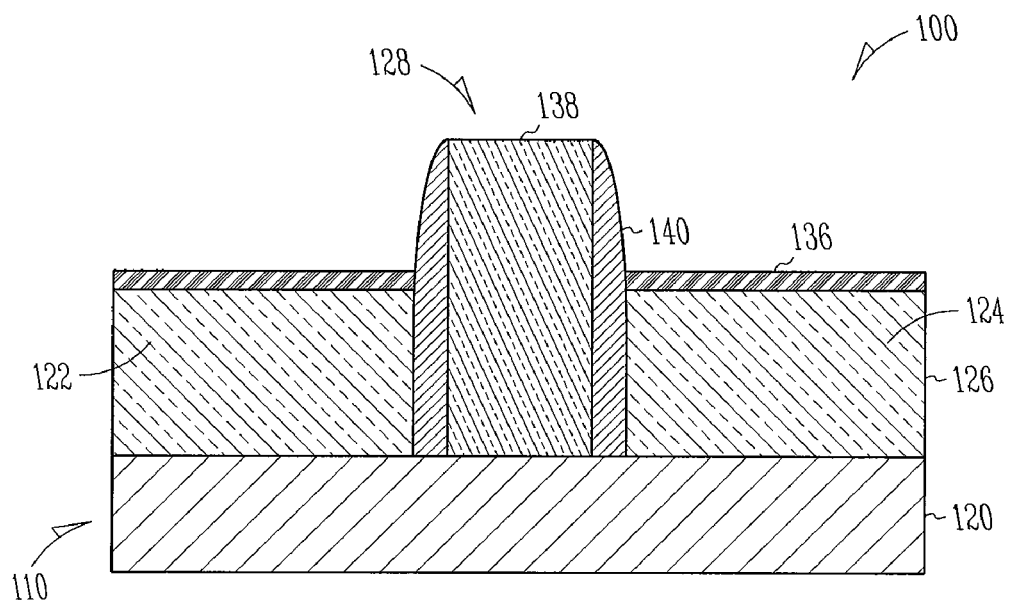
FIG. 2A-2D are sectional detail views of manufacturing intermediates of the bipolar transistor of FIG. 1 at various stages in the manufacturing process, taken along section line 2-2' of FIG. 1.
Figure 3A:
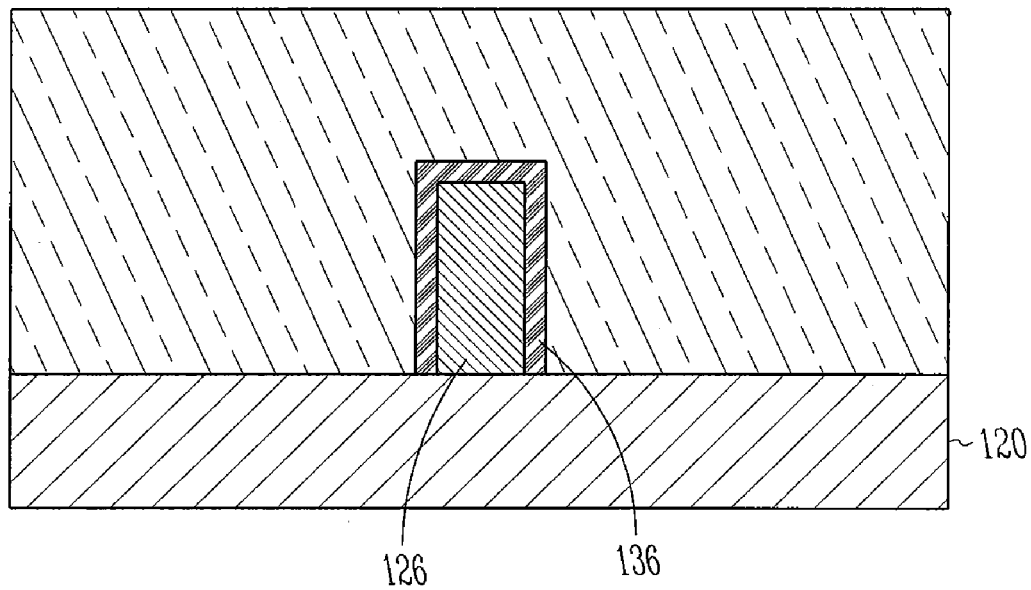
FIGS. 3A-3D are sectional detail views of manufacturing intermediates of the bipolar transistor of FIG. 1 at various stages in the manufacturing process, taken along section line 3-3' of FIG. 1, manufactured using the process of FIG. 5.
Figure 3B:
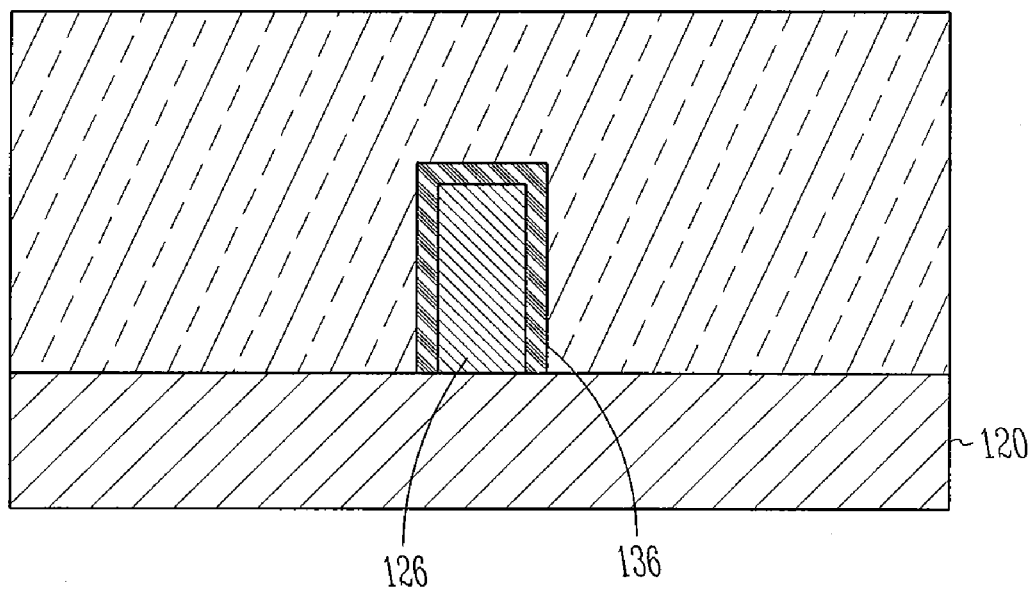
Figure 3C:
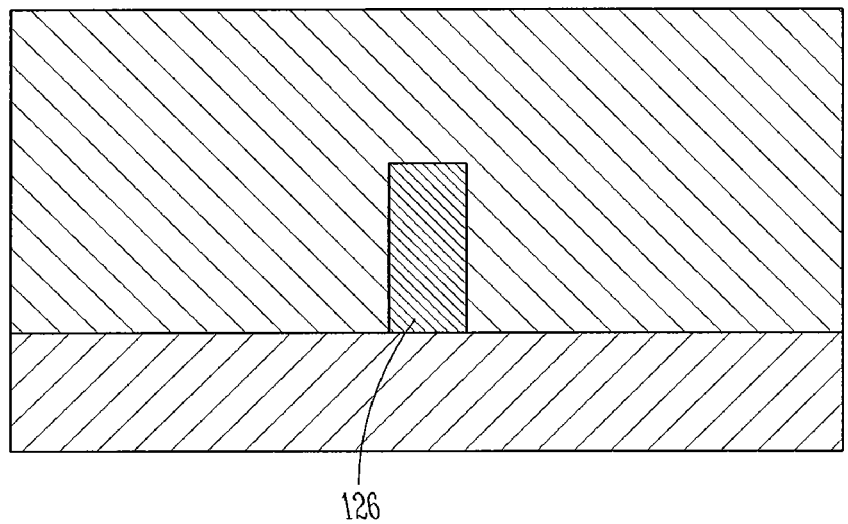
Figure 3D:
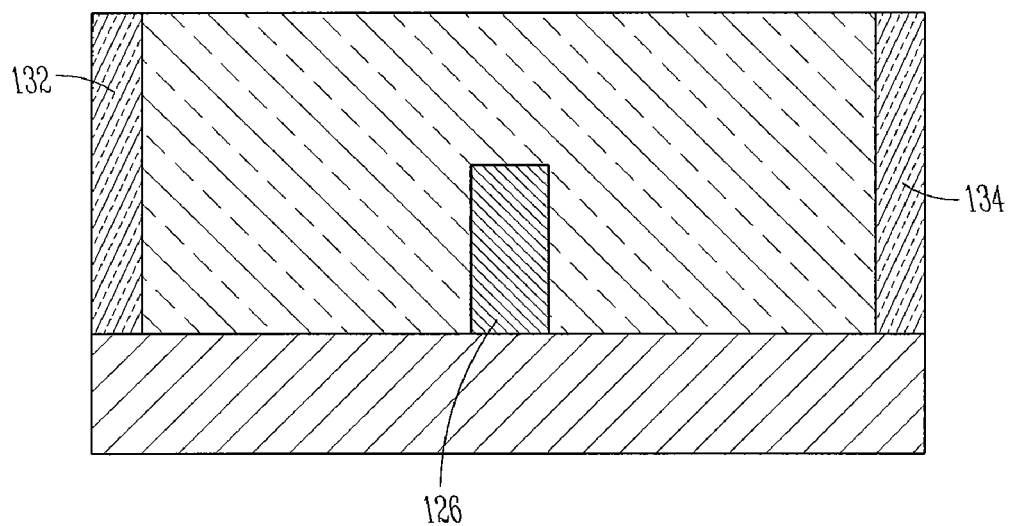
Figure 4A:
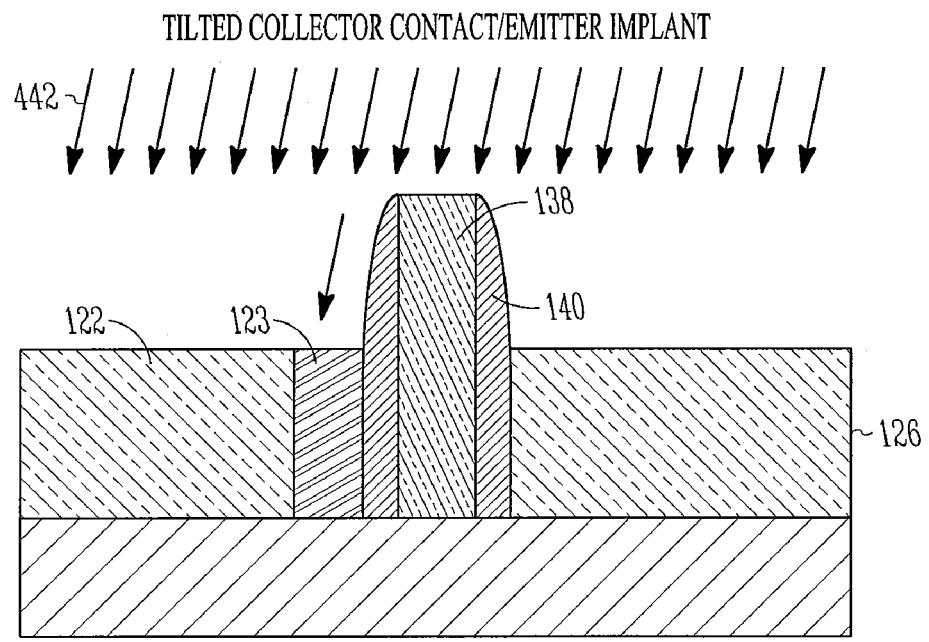
FIGS. 4A and 4B are sectional views of another embodiment of the manufacturing intermediate of the bipolar transistor that was illustrated in FIGS. 2B and 3B, manufactured using the process of FIG. 6.
Figure 4B:
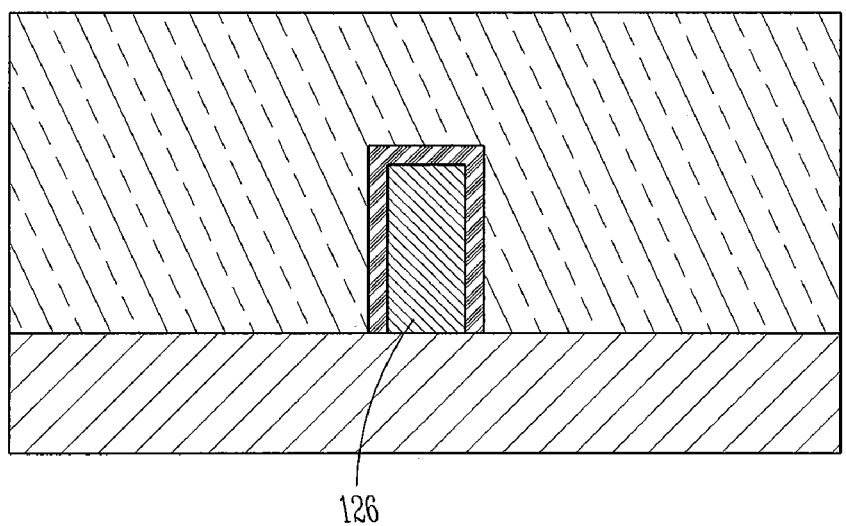

As shown in FIGS. 2A and 3A, the structure of a single finned transistor 100 is shown at an intermediate point 520 in the manufacturing process of FIG. 5, after formation of the fin 126 and formation of the base stack that will later become the base region of fin 126.

FIG. 5 is a process flow diagram for some embodiments of a manufacturing process for the manufacture of finned bipolar transistors. In some embodiments, the process for manufacturing bipolar transistors produces bipolar transistors contemporaneously with FinFET transistors. For each process operation in FIG. 5, a description is provided in separate columns of what that process operation provides for the finned bipolar (FinBIP) transistor and the FinFET CMOS transistor.

In some embodiments, the manufacturing process begins at block 501 with providing a wafer 110 which includes a prepared wafer surface which has a silicon region overlying a buried oxide layer 120 which is supported by a silicon substrate 120. The wafer surface silicon region is lightly doped in a planar collector implant operation 502, as shown in FIG. 5, to form planar collector implant regions of the wafer surface where the fins 126 of the bipolar transistors 100 will be formed in subsequent operations.

The collector implant doping process 502 will result in a lightly-doped collector region 122 in the fin structure 126 of finished bipolar transistor 100. If both bipolar and CMOS devices are being contemporaneously formed on the same wafer 120, the same implantation operation 502 which provides the lightly doped collector 122 for the bipolar device may also be used, in some embodiments, to provide well doping in the CMOS FinFET devices being contemporaneously formed on the same substrate.

Fins 126 for both finned bipolar transistors 100 and for FinFETs are produced by a photolithography and selective etching process 503. In some embodiments, process 503 commences with the deposition of a hardmask material which is resistant to aggressive etch chemistries such as plasma etching. In further action 503, a series of lithography processes to form fin structure 126 are performed using fin forming operations corresponding to those that are followed for manufacturing FinFET devices. The lithography processes include selectively etching, in block 503, the wafer surface to form an elongated fin 126 with a collector region 122 including a portion of the collector implant previously formed.

The same hardmask and photolithography processes 503 used to form the bipolar fins 126 can be performed on the areas of the chip where FinFET devices are to be formed to provide a FinFET fin. Thus the fin structures 126 for finned bipolar devices and those for contemporaneously formed Fin-FETS use the same process 503 that is utilized for forming fins in FinFET devices.

In a further operation 505 through 507, in some embodiments, a sacrificial dielectric layer 136 is applied to provide an etchstop during a later etching operation 507. Base and gate lithography 506 and anisotropic etching processes 507 are contemporaneously performed next on the bipolar finned transistor and FinFETs. These operations form a polysilicon sacrificial base deposit 138 between a pair of oxide sidewall spacers 140. Sacrificial base deposit 138 will later be replaced by base electrode material in a further operation 521. The operations that form the bipolar transistor base region also contemporaneously form a gate electrode in FinFETs formed on the same substrate. Sidewall oxide spacers 140 provide spacing between the emitter/collector regions 122 and 124 and the base region 128.

Bipolar transistor base region 128, analogous to the gate of a FinFET structure, is formed intermediate the ends of the fin 126. The results of the base forming operations contemporaneously carried out to form base region 128 for the finned bipolar transistor 100 are shown in FIG. 2A. Gate regions for FinFET transistors formed on the same substrate 110.

Figure 2B:
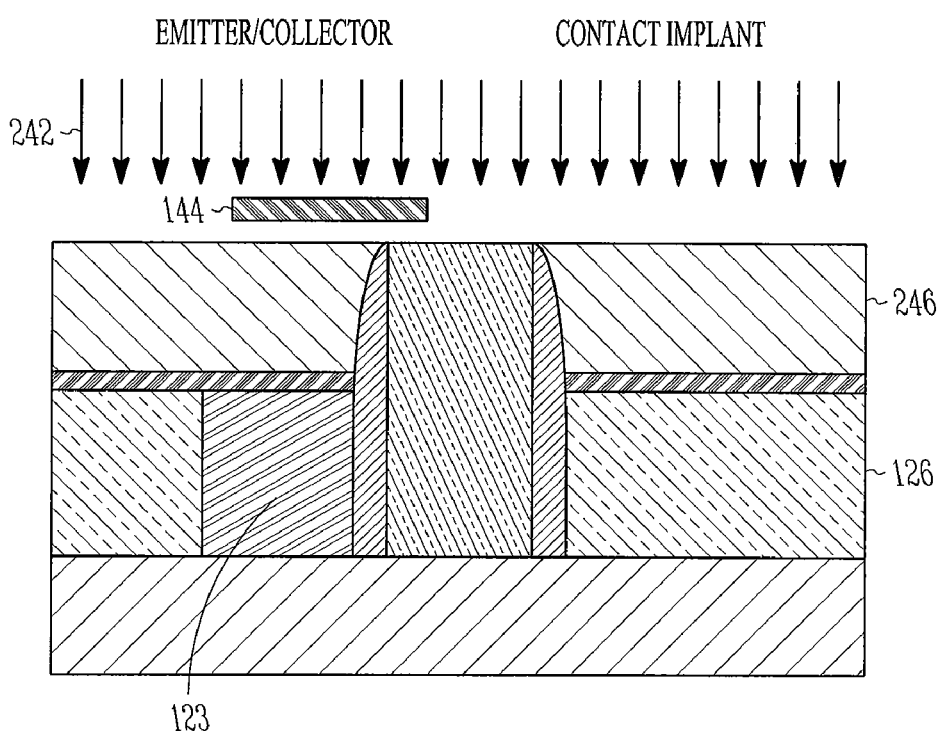

In some embodiments, extension implants are formed for the FinFET transistors in a further process operation 509. Extension implant regions are not added to the bipolar finned transistors. Nitride spacers 142 are then formed in operation 510 and lithography operations 511 and implant operations 512 are performed to form the bipolar emitter and collector areas 122 and 124. In FIG. 2B, doping 242 is applied in operation 512, as shown in the process flow diagram of FIG. 5, for forming an emitter region 124 between the base region and an end of the fin 126. In some embodiments, the same doping is applied for forming a collector region 122 between the base region and the other end of the fin.

To achieve a doping gradient for the base collector junction, the collector region 126 is more heavily doped than a lightly doped collector region 123 and other doped regions. In some embodiments, a resist mask 144 was applied to the surface above the emitter region 124, as shown in FIG. 2B. The mask 144 blocks a portion of the doping implant to reduce the dose received below the resist mask 144. The FinFET source and drain regions are formed in a contemporaneous operation performed on FinFET transistors on the same substrate.

The arrows 242 in FIG. 2B signify the application of doping operations 516 to form emitter and collector regions. The arrows 242 also show that in some embodiments, the doping operations are carried out with the doping applied substantially perpendicular to the surface of substrate 110.

FIG. 4 is a view of an embodiment of a manufacturing intermediate of a FinBIP formed using an alternative doping process to the one shown and discussed relative to FIG. 2B. FIG. 6 is a step-by-step outline of further embodiments of the manufacturing process as it applies to the formation of the bipolar and FinFET transistors shown in FIG. 4. Specifically, the process embodiments of FIG. 6 are similar to those shown in FIG. 5. In operations 611 and 612 the resist mask of operations 511 and 512 is not used. Instead, the implant beam is tilted away from the vertical so that the lightly doped collector area falls into the shadow of the sacrificial "gate structure" formed at operations 604 through 607. The shadow prevents the full implant from being delivered to the lightly doped collector area and allows creation of a base-collector doping gradient which will be fine tuned in operation 616 when the tilted base implant is delivered.

In FIG. 4, the doping 442 is applied in the operation at 612 of FIG. 6, at an angle the perpendicular across the entire region where the finned transistor is being formed. In this alternative embodiment, no resist mask is needed to create a doping distribution. Because base implant material 138 and sidewalls 140 extend upwardly from the fin 126, the base implant stack shields the fin 126 adjacent the base region to provide the desired doping gradient to form a lightly doped collector region 123 of collector 122 adjacent the base implant.

Following the injection of the collector and emitter doping following a process 512 or 612 as illustrated in either FIG. 2B or FIG. 4, a layer of BSG 246 is formed and then treated by a CMP operation 513 to complete the formation of the manufacturing intermediate structure illustrated in FIG. 2B. In some embodiments, the upper surface of the BSG layer 246 is flush with the base sacrificial region 138 and serves as an etch block to allow a selective etching in operation 514 of just the sacrificial material 138 in the "gate stack" region that will become base region 128 of the bipolar transistor and the gate of the FinFET.

In the base etching operation 514, the base region 128 is etched down to the oxide layer 136 on fin 126 and to the spacer regions 140 lining the base region cavity. Following this etching, the width of the base region to be formed is adjusted in operation 515 by depositing inner spacers 142 in the bipolar base region 128. The spacer material contemporaneously formed in the FinFET gate regions are removed again from the FinFET devices.

Figure 2C:
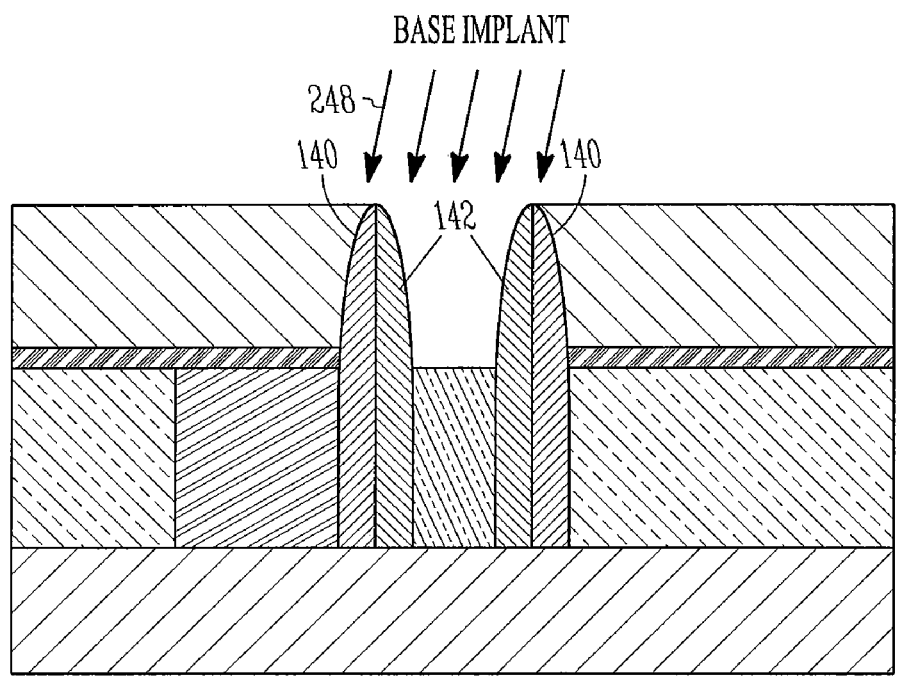

In FIG. 2C, arrows 248 are shown to signify the tilted base implant doping operation 516. The base implant doping is applied at an angle to the perpendicular to reduce the doping load in the lightly doped collector region 123 to fine tune the desired base-collector doping level gradient.

In process block 518 the sacrificial dielectric layer is etched away. A gate dielectric deposition process 518 The gate dielectric is needed to provide an insulated gate in CMOS transistors and is also contemporaneously and temporarily applied to the bipolar transistor. It is removed from the finned bipolar transistor 100 after a lithographic process is applied to expose the base areas of the bipolar transistors, as well as the collector and emitter electrodes, while the gate regions of the CMOS remain protected from that etching process by a patterned etch blocking layer.

Figure 2D:
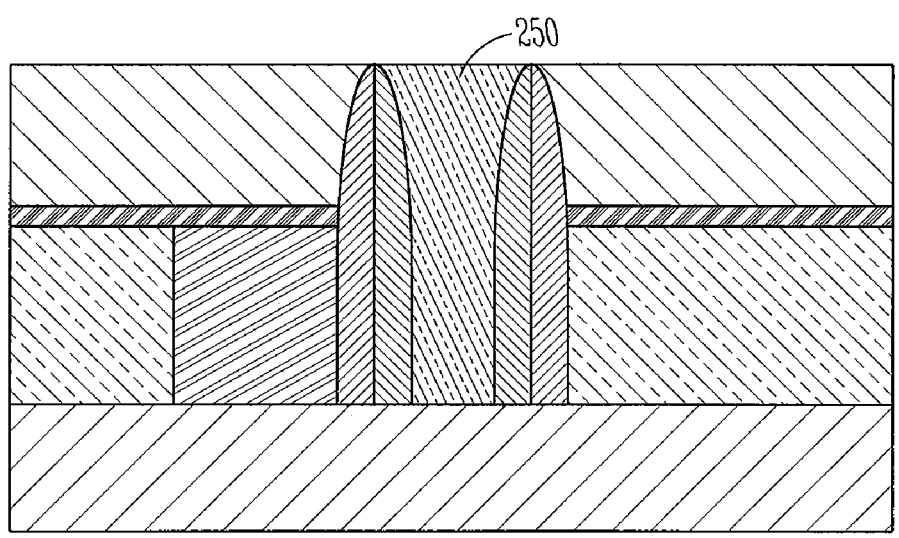

After the lithography and etch processes 519 and 520 for removal of the dielectric oxide layer 138 in the base region of the bipolar transistors, a deposition process 521 is performed to deposit a base electrode conductor 250 formed of polysilicon or other metals as illustrated in FIG. 2D. That region is directly connected to the base region of the fin. In the contemporaneously formed FinFETs similarly formed regions to provide an insulated gate electrode for the FinFET transistors.

In a further operation 522, CMP planarization is then performed to make a smooth surface for the wafer with the implanted base electrode region and the emitter and collector region exposed for connection in a suitable back-end-of-line (BEOL) interconnection process 523, to connect the transistor electrodes to the conductive interconnection layers (not shown).

FIG. 7 is a step-by step outline of further embodiments of the manufacturing process as it as it applies to the formation of the bipolar and FinFET transistors. In this process the BiCMOS structure is formed without forming and replacing a sacrificial gate structure as was illustrated in the processes shown in FIGS. 5 and 6 and discussed above. The intermediate structures created as the process of FIG. 7 are carried out are illustrated in FIGS. 8A and 8B and FIGS. 9A and 9B.

The process in FIG. 7 commences at 701 with preparation of the wafer surface. In the process at block 702 a base implant doping is applied in the area of the wafer where the bipolar transistor base will be formed. In that same operation 702, well doping for contemporaneously formed FinFET CMOS devices may also be implanted In operation 703 fins 826 for the bipolar and FinFET transistors are contemporaneously formed by etching and lithography operations analogous to those of blocks 503 and 603 of FIGS. 5 and 6. A conductive layer of a material such as CoSi is applied to the fin 826 in the bipolar region in operation 704 to serve as an etchstop for the etching process to be carried out in block 707. In the FinFet device regions, the conducting layer needs to be removed in CMOS areas. If the CoSi material is used for the deposited conducting layer, silicidation is avoided in CMOS areas by suitable masking, for example.

In operations 705-707 a gate stack and hardmask is applied to the bipolar and finFET devices, gate lithography is performed to define a base electrode 828 for the bipolar devices and to define gates for the FinFETs and in etching step 707, the base and gate electrodes are etched to the conductive layer. The conductive layer is removed in operation 708.

In the operations at block 709 and 710, sidewall 840 and oxide spacers are formed to space the emitter/collector 832 and 834 and base regions 828 of the bipolar transistors and extensions for the FETs.

Figure 8A:
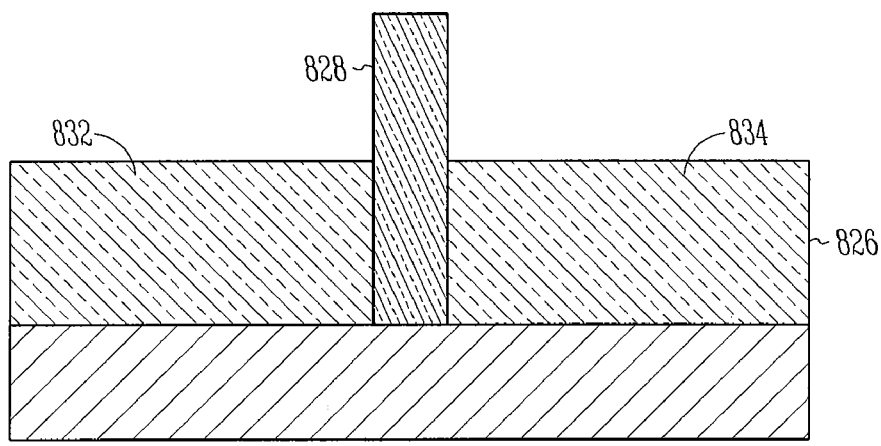
FIGS. 8A-8B and 9A-9B are sectional views of another embodiment of the manufacturing intermediate of the bipolar transistor that was illustrated in FIGS. 2B and 3B, manufactured using the process of FIG. 7.
Figure 8B:
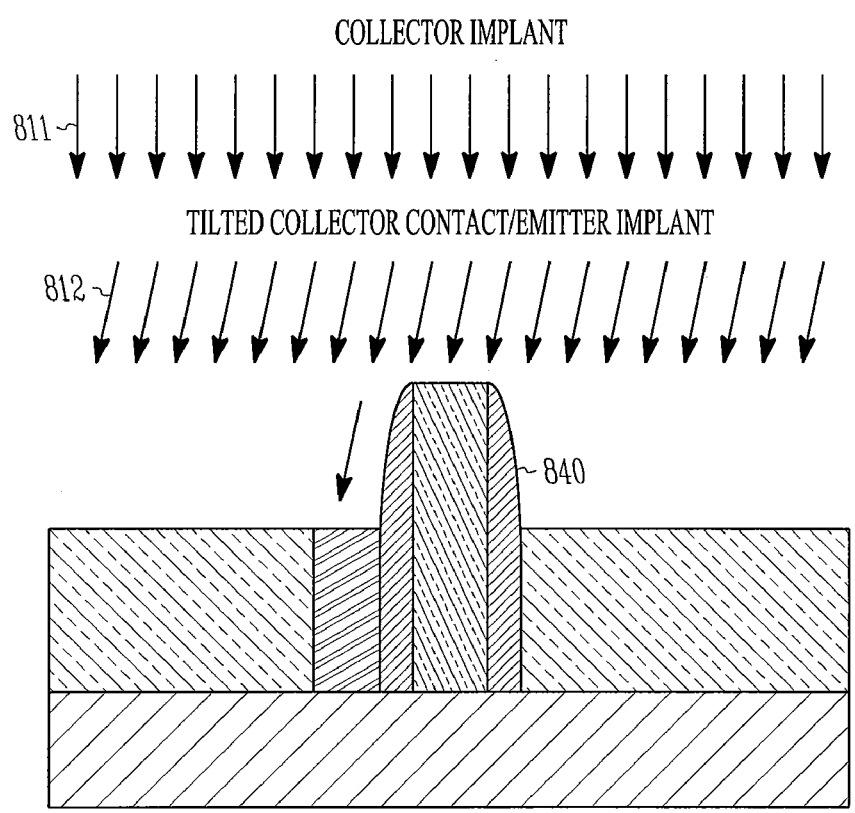
Figure 9A:
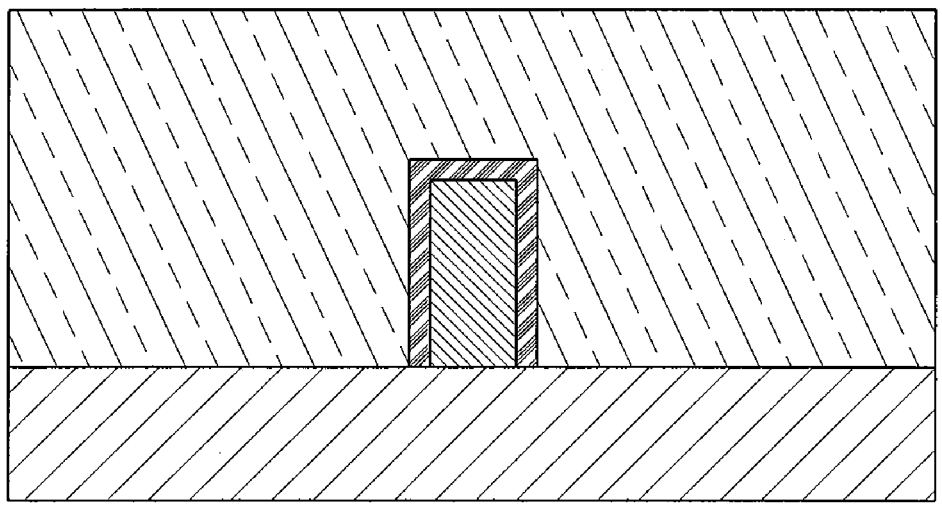
Figure 9B:
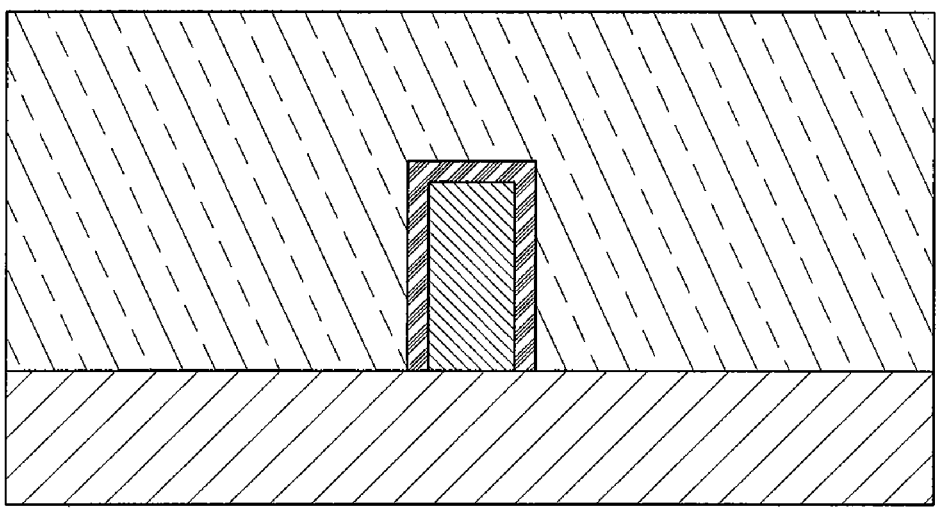

In operations 711 and 712 collector implants are formed. In operation 711, the doping implant 811, shown in FIG. 8B, is oriented substantially vertical to the surface of the wafer to apply light collector doping. This implant 811 makes only a negligible contribution to the S/D/doping of the FinFET. In some embodiments, in block 712a, a tilted implant operation 812 is performed with the lightly doped collector region shadowed from application of the implant. In some other embodiments, in block 712b, a resist mask, not shown in FIG. 8B, is used to protect the lightly doped collector area from a vertical implant which is also applied to the S/D regions of the FinFET CMOS.

The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims.

We claim:

1. A bipolar transistor, comprising:
   an emitter region at one position along the axis of a fin structure supported above a surface of a substrate;
   a collector region at another position along the axis of the fin structure;
   a base region between the emitter and collector regions; and
   a contact line in direct contact with the base region.

2. The transistor of claim 1, wherein the contact line is a conductive material.

3. The transistor of claim 2, wherein the conductive material is metallic or is a metal.

4. The transistor of claim 2, wherein the conductive material is polysilicon.

5. The transistor of claim 1, wherein the emitter region, the collector region, and the base region are made of one or more semiconductor materials selected from a group of semiconductor materials consisting of silicon, germanium, silicon carbide, gallium arsenide, and indium phosphide.

6. The transistor of claim 1, wherein the emitter region comprises a heavily doped region.

7. The transistor of claim 1, wherein the collector region comprises a heavily doped sub-region, and a lightly doped sub-region between the base region and the heavily doped sub-region.

8. The transistor of claim 1, wherein the substrate includes a buried oxide (BOX) layer.

9. The transistor of claim 1, wherein a space between the substrate, the emitter region, the collector region, the base region, and the base contact structure is filled with BPSG (borophosphosilicate glass) or $SiO_2$ (silicon oxide).

10. The transistor of claim 1, wherein the substrate includes a silicon substrate.

11. The transistor of claim 1, wherein the substrate includes an oxide layer.

12. The transistor of claim 1, wherein the substrate includes an oxide layer overlying a silicon substrate.

13. The transistor of claim 1, wherein the contact line overlies a top and a sidewall surface of the fin structure.

14. The transistor of claim 1, wherein the contact line overlies the substrate.

15. A bipolar transistor, comprising:
    a fin structure including an emitter region, a collector region and a base region between the emitter region and the collector region; and
    a contact line in direct contact with the base region.

16. The transistor of claim 15, wherein the emitter region, the collector region, and the base region include one or more semiconductor materials selected from a group of semiconductor materials consisting of silicon, germanium, silicon carbide, gallium arsenide, and indium phosphide.

17. The transistor of claim 15, wherein the fin structure overlies an oxide layer.

18. The transistor of claim 15, wherein the fin structure overlies a silicon substrate.

19. The transistor of claim 15, wherein the fin structure overlies an oxide layer and the oxide layer overlies a silicon substrate.

20. The transistor of claim 15, wherein the fin structure is elongated, the emitter being at a first position along the direction of elongation and the collector being at a second position along the direction of elongation.

21. The transistor of claim 15, wherein the fin structure overlies a substrate.

22. The transistor of claim 21, wherein the substrate comprises a silicon substrate.

23. The transistor of claim 21, wherein the substrate comprise an oxide layer.

24. The transistor of claim 21, wherein the substrate comprises an oxide layer overlying a silicon substrate.

25. The transistor of claim 15, wherein the contact line comprises a conductive material.

26. The transistor of claim 25, wherein the conductive material is a metallic material.

27. The transistor of claim 25, wherein the conductive material is a polysilicon material.

28. The transistor of claim 15, wherein the contact line overlies a top surface and a sidewall surface of the fin structure.

* * * * *